United States Patent
McCall et al.

(10) Patent No.: US 7,246,022 B2
(45) Date of Patent: Jul. 17, 2007

(54) INITIATION OF DIFFERENTIAL LINK RETRAINING UPON TEMPERATURE EXCURSION

(75) Inventors: James A. McCall, Beaverton, OR (US); Klaus Ruff, Beaverton, OR (US); David Shykind, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/156,837

(22) Filed: Jun. 20, 2005

(65) Prior Publication Data

US 2006/0284733 A1    Dec. 21, 2006

(51) Int. Cl.
G01K 1/20 (2006.01)
(52) U.S. Cl. .......................... 702/99; 324/105; 331/70; 331/176; 331/177 R; 331/187; 368/202; 700/71; 700/299; 702/85; 702/132
(58) Field of Classification Search ............. 324/76.11, 324/105; 374/141; 700/1, 71, 299; 702/85, 702/99, 117, 127, 130, 132; 331/45, 70, 331/176, 177 R, 187; 368/200, 201, 202
See application file for complete search history.

(56) References Cited

U.S. PATENT DOCUMENTS

| | | | | |
|---|---|---|---|---|
| 3,713,033 A | * | 1/1973 | Frerking ................. | 331/116 R |
| 4,473,303 A | * | 9/1984 | Suzuki ........................ | 368/201 |
| 4,746,879 A | * | 5/1988 | Ma et al. ...................... | 331/44 |
| 4,922,212 A | * | 5/1990 | Roberts et al. ............. | 331/176 |
| 5,268,601 A | * | 12/1993 | Cossins ....................... | 327/350 |
| 5,278,457 A | * | 1/1994 | Fujita et al. ................. | 327/237 |
| 5,471,498 A | * | 11/1995 | Kuo ............................ | 375/295 |
| 5,502,838 A | * | 3/1996 | Kikinis ....................... | 713/501 |
| 5,506,900 A | * | 4/1996 | Fritz .......................... | 379/402 |
| 5,519,728 A | * | 5/1996 | Kuo ............................ | 375/257 |
| 5,590,061 A | * | 12/1996 | Hollowell et al. .......... | 702/130 |
| 5,940,785 A | * | 8/1999 | Georgiou et al. ........... | 702/132 |
| 6,055,489 A | * | 4/2000 | Beatty et al. ............... | 702/130 |
| 6,263,194 B1 | * | 7/2001 | Chan et al. ............. | 455/115.1 |
| 6,362,699 B1 | * | 3/2002 | Fry ............................. | 331/176 |
| 6,393,577 B1 | * | 5/2002 | Akamatsu et al. .......... | 713/600 |
| 6,407,595 B1 | * | 6/2002 | Huang et al. ............... | 327/114 |
| 6,484,232 B2 | * | 11/2002 | Olarig et al. ............... | 711/105 |
| 6,564,288 B2 | * | 5/2003 | Olarig et al. ............... | 711/105 |
| 6,788,159 B2 | * | 9/2004 | Takahashi et al. .......... | 331/176 |
| 6,943,588 B1 | * | 9/2005 | Luo et al. ..................... | 326/86 |
| 7,036,030 B1 | * | 4/2006 | Altmejd ...................... | 713/322 |
| 2002/0066047 A1 | * | 5/2002 | Olarig et al. ............... | 713/323 |
| 2002/0087904 A1 | * | 7/2002 | Cai ............................. | 713/322 |
| 2002/0124202 A1 | * | 9/2002 | Doody et al. ................. | 714/5 |
| 2003/0060934 A1 | * | 3/2003 | Walsh ........................ | 700/299 |
| 2003/0067361 A1 | * | 4/2003 | Takahashi et al. .......... | 331/176 |
| 2006/0039232 A1 | * | 2/2006 | Choi .......................... | 365/233 |
| 2006/0284733 A1 | * | 12/2006 | McCall et al. .............. | 340/584 |

FOREIGN PATENT DOCUMENTS

JP        09-069773 A    *  3/1997
JP        2004-95157 A   *  3/2004

* cited by examiner

*Primary Examiner*—Edward Cosimano
(74) *Attorney, Agent, or Firm*—Buckley, Maschoff & Talwalkar LLC

(57) ABSTRACT

A method includes detecting a change in temperature in an integrated circuit that is coupled to a differential communication link, and responding to the detected change in temperature by initiating a retraining process for the differential communication link.

6 Claims, 5 Drawing Sheets

INITIATION OF DIFFERENTIAL LINK RETRAINING UPON TEMPERATURE EXCURSION

BACKGROUND

Differential communication links, sometimes referred to as "high speed" links, are often used to transmit data from one integrated circuit to another within a computer system. In a typical differential link, one of the two devices attached to the link functions as a master device and the other functions as a slave. It is a common practice for the master device to initiate and perform a retraining process at regular time intervals to maintain link parameters and characteristics, such as the shape of the data eye, in an appropriate condition for reliable communication via the link.

There may be a trade-off involved in the timing of the retraining process. If the time interval between retraining processes is relatively short, the bandwidth provided by the link may be adversely affected. If the time interval between retraining processes is relatively long, the operating condition of the link may deteriorate such that the link fails to function.

DETAILED DESCRIPTION

Figure 1:
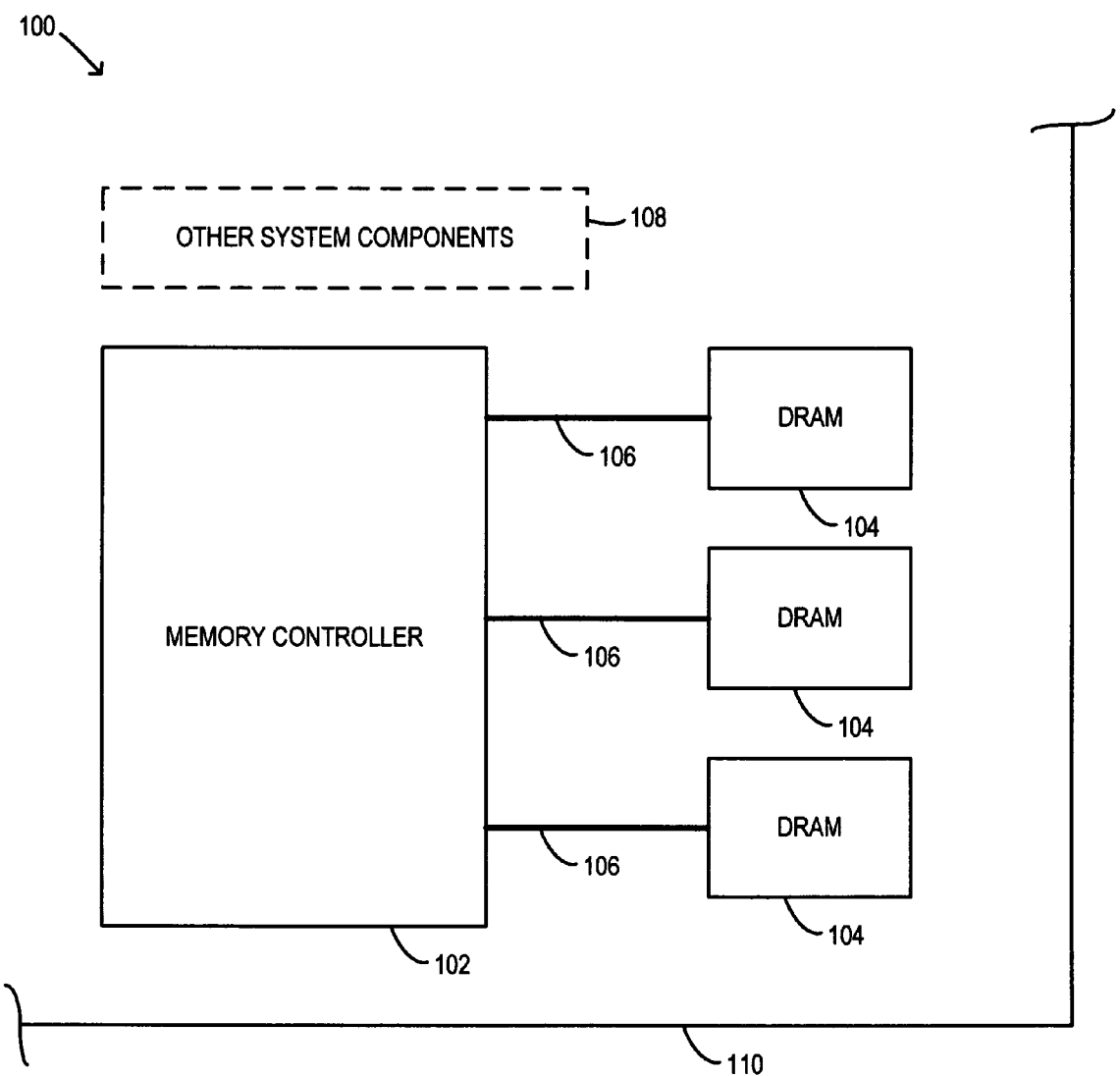
FIG. 1 is a block diagram of a system according to some embodiments.

FIG. 1 is a block diagram of a system 100 provided according to some embodiments. The system 100 includes a memory controller 102 and a number of dynamic random access memory (DRAM) devices 104. Each of the DRAMs 104 is coupled to the memory controller 102 by a respective differential data communication link 106. For example, each of the links 106 may be a LVDS (low voltage differential signal) link. (Each link 106 is represented by a single line in the drawing, although in practice each link may include a pair of parallel continuous conductors.) Each of the memory controller 102 and the DRAMs 104 may be implemented as a respective integrated circuit.

The system 100 may, except for aspects (described below) of the memory controller 102 and of the DRAMs 104, be a conventional personal computer or laptop computer, and may include conventional computer system components (represented by block 108) such as a microprocessor, a network controller, a graphics controller (which may be integrated with the memory controller 102), a disk drive, input/output devices, etc. It will be appreciated that at least some of the other system components 108, such as the microprocessor which is not separately shown, may be connected to the memory controller 102, although no such connection is explicitly shown in the drawing.

The system 100 also includes a circuit board 110 (e.g., a printed circuit board) on which the memory controller 102, the DRAMs 104 and/or at least some of the other system components 108 may be mounted. At least a portion of at least some of the links 106 may be routed or otherwise supported on the circuit board 110.

Figure 2:
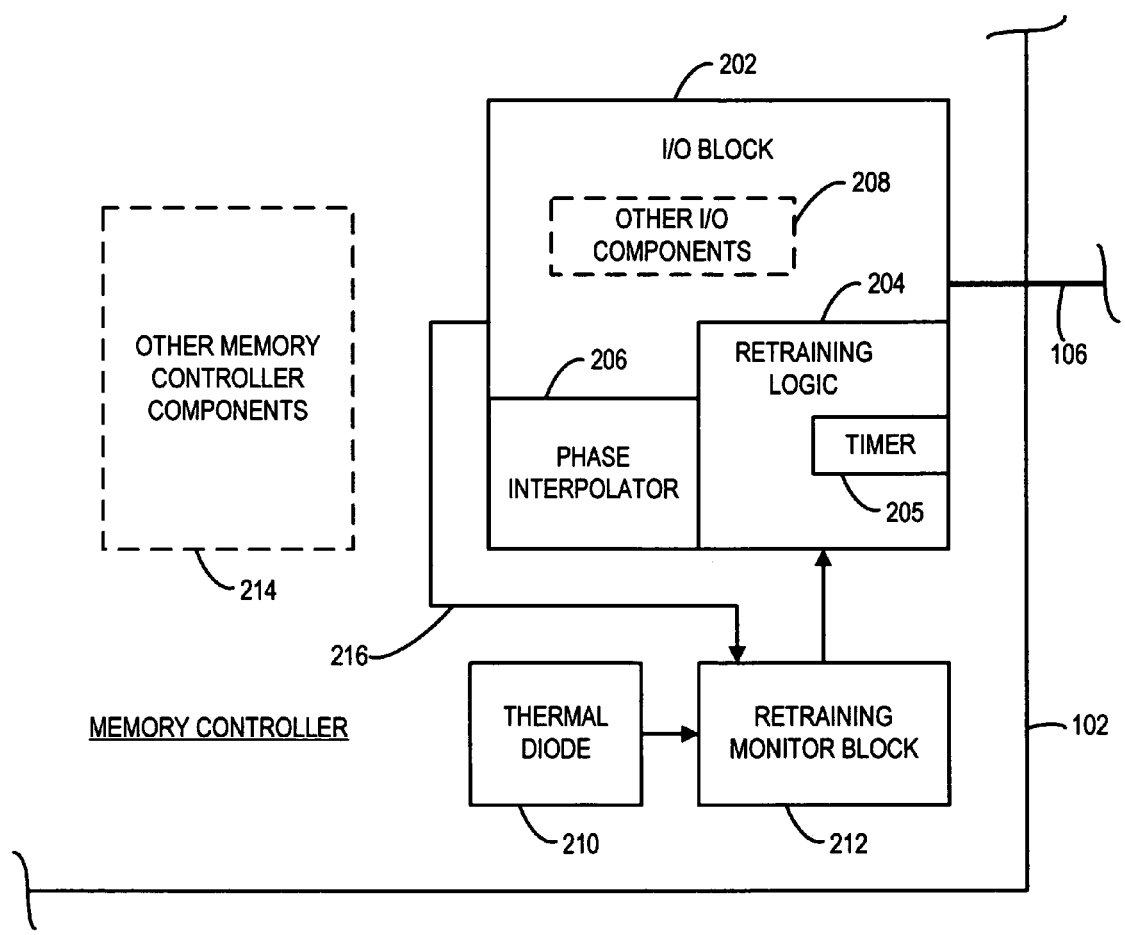
FIG. 2 is a block diagram of a memory controller that is part of the system of FIG. 1.

FIG. 2 is a block diagram of the memory controller 102. As seen from FIG. 2, the memory controller 102 includes an input/output (I/O) block 202. The I/O block 202 is coupled to one of the differential data communication links 106. (In some embodiments, the memory controller 102 may include additional I/O blocks, which are not explicitly shown. There may be one such additional I/O block for—and coupled to—each differential communication link to which the memory controller 102 is coupled.)

The I/O block 202 includes retraining logic 204. The retraining logic 204, as will be seen, may operate on certain occasions to control the I/O block 202 to perform a retraining process with respect to the link 106 to which the I/O block 202 is coupled. The retraining process itself may be performed in accordance with conventional principles, although the manner of triggering the retraining logic to initiate the retraining process may be in accordance with certain embodiments as described herein. In some embodiments, the retraining logic 204 may include a timer 205 to trigger the retraining logic to initiate retraining at regular intervals as a backup to event-triggering of retraining, as described below. The timer 205 may be reset each time retraining is performed.

The I/O block 202 may also include a phase interpolator 206. In addition to other conventional aspects of the retraining process, the retraining logic 204 may interact with the phase interpolator 206 to adjust the phase of a clock signal output from the phase interpolator 206.

Further, the I/O block 202 may include other components (indicated by block 208) which may be provided in accordance with conventional practices to allow the I/O block 202 to perform the normal operations of the I/O block 202.

The memory controller 102 also includes a thermal diode 210 which is incorporated in the memory controller 102 to detect and indicate changes in temperature in the memory controller 102. The thermal diode 210 may be located adjacent the I/O block 202, as suggested by the drawing (FIG. 2), or may be located elsewhere in the integrated circuit (not separately shown) which constitutes the memory controller 102. In some embodiments, there may be more than one thermal diode in the memory controller 102. For example, there may be a respective thermal diode provided adjacent each I/O block in the memory controller 102.

In some embodiments, the memory controller 102 may include a temperature sensing device other than a thermal diode in place of the thermal diode 210.

In addition, the memory controller 102 includes a retraining monitor block 212. The retraining monitor block 212 is coupled to the thermal diode 210 to read an output signal from the thermal diode 210. The monitor block 212 may operate to detect when the temperature in the memory controller 102 departs by more than a threshold amount from a previously set base temperature. The monitor block 212 is also coupled to the retraining logic 204 to provide to the retraining logic 204 a signal that indicates a change in temperature indicated by the thermal diode 210.

Further, the memory controller 102 may include additional components (indicated by block 214) which may be provided in accordance with conventional practices to allow the memory controller 102 to perform its customary functions. At least some of the other components 214 may be coupled to the I/O block 202, although no connection is explicitly shown.

Figure 3:
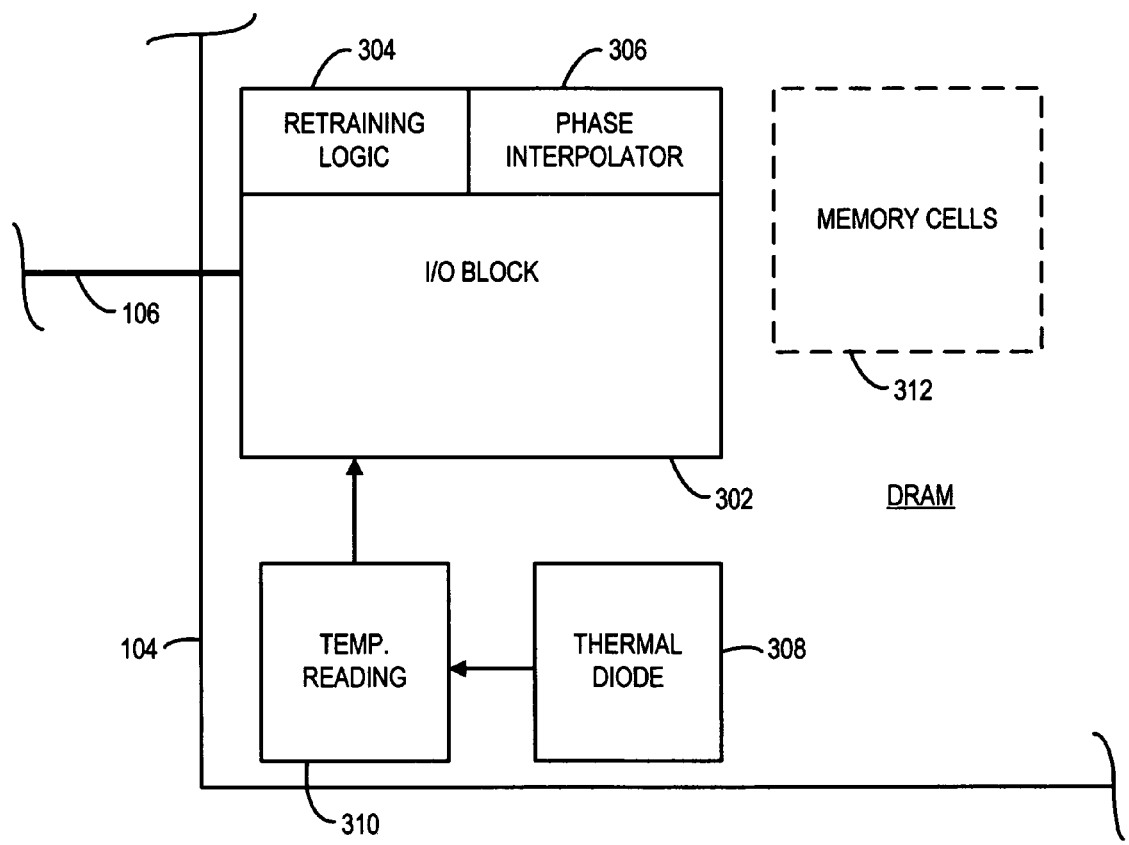
FIG. 3 is a block diagram of a dynamic random access memory (DRAM) device that is part of the system of FIG. 1.

FIG. 3 is a block diagram of a typical one of the DRAMs 104 shown in FIG. 1.

The DRAM 104 includes an I/O block 302. The I/O block 302 is coupled to the differential data communication link 106 that connects the DRAM 104 to the memory controller 102 (FIG. 1, not shown in FIG. 3). The I/O block 302 includes retraining logic 304. The retraining logic 304 is operative to cooperate via the link 106 with the retraining logic 204 (FIG. 2) of the memory controller 102 to carry out a retraining process in accordance with conventional practices.

The I/O block 302 may also include a phase interpolator 306. In addition to other conventional aspects of the retraining process, the retraining logic 304 may interact with the phase interpolator 306 to adjust the phase of a clock signal output from the phase interpolator 306.

In addition, the I/O block 302 may include other components which are provided in accordance with conventional practices and which are not separately indicated in the drawing.

The DRAM 104 also includes a thermal diode 308 which is incorporated in the DRAM 104 to detect and indicate changes in temperature in the DRAM 104. The thermal diode 308 may be located adjacent the I/O block 302, as suggested by the drawing (FIG. 3), or may be located elsewhere in the integrated circuit (not separately shown) which constitutes the DRAM 104.

In some embodiments, the DRAM 104 may include a temperature sensing device other than a thermal diode in place of thermal diode 308.

In addition, the DRAM 104 may include a temperature reading block 310. The temperature reading block 310 is coupled to the thermal diode 308 to read an output signal from the thermal diode 308. The temperature reading block 310 may operate to detect when the temperature in the DRAM 104 departs by more than a threshold amount from a previously set base temperature. The temperature reading block 310 is also coupled to the I/O block 302 to cause the I/O block to transmit, to the memory controller 102, data or another signal that indicates to the memory controller 102 that a temperature change of at least a given amount has been detected in the DRAM 104.

Also, the DRAM 104 includes conventional memory cells 312 and possibly other conventional components (not separately shown) to allow the DRAM 104 to perform customary functions of a dynamic random access memory, such as storing and reading out data. Although not explicitly indicated in the drawing, there may be connections between the memory cells 312 and the I/O block 302.

Figure 4:
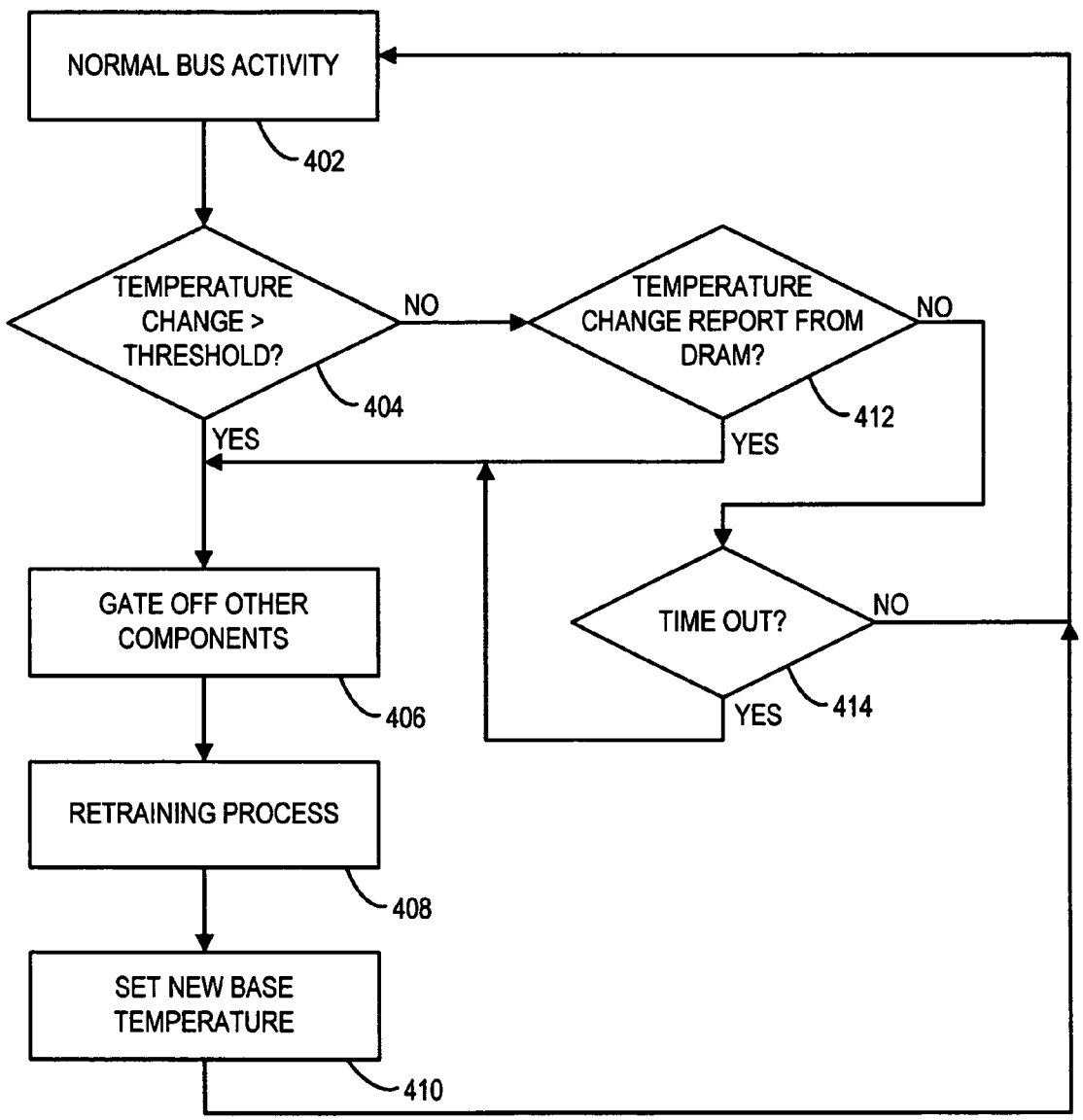
FIG. 4 is a flow chart that illustrates a process performed in the memory controller of FIG. 2.

FIG. 4 is a flow chart that illustrates a process performed in the memory controller 102.

Block 402 in FIG. 4 connotes normal exchange of data over the communication link 106 (FIG. 2) between the memory controller 102 and the DRAM (not shown in FIG. 2) that is at the other end of the link 106.

At decision block 404 in FIG. 4, a determination is made (e.g., by the retraining monitor block 212, FIG. 2) as to whether the thermal diode 210 indicates a change (in excess of a threshold amount, and relative to a base temperature setting) in the temperature in the memory controller 102. If a positive determination is made at 404 (i.e., if such a change in temperature is detected), then (as indicated at 406) the retraining monitor block 212, or another component of the memory controller 102, may gate off (disable) components of the memory controller which are not needed during retraining. Further, in response to the detection of the temperature change, the monitor block 212 may trigger the retraining logic to initiate and perform a retraining process (indicated at 408 in FIG. 4) with respect to the link 106. The retraining process itself may be performed in a conventional manner and may involve testing and modification of parameters related to the communication link 106 so as to assure proper operation of the communication link.

In addition, upon or after performance of the retraining process, the monitor block 212 may reset (as indicated at 410 in FIG. 4) the base temperature to the current temperature indicated by the thermal diode 210. The process of FIG. 4 then returns to normal activity (block 402) on the communication link.

Considering again decision block 404, if a negative determination is made at that block (i.e., if a change in temperature in excess of the threshold amount is not detected), then decision block 412 follows. At decision block 412, it is determined whether the DRAM at the other end of the link has transmitted, to the memory controller, data or another signal to indicate that a change in temperature has been detected in the DRAM. The determination at block 412 may, for example, be made by the monitor block 212, which may receive from the I/O block 202 (as indicated at 216) the data from the DRAM which indicates the occurrence of the change in temperature in the DRAM. If a positive determination is made at 412 (i.e., if such data is received), then the operations indicated at 406-410 follow, followed in turn by a return to the normal bus activity 402. In other words, detection of a temperature change in the DRAM may lead to the memory controller initiating and performing the retraining process.

Considering again decision block 412, if a negative determination is made at that block (i.e., if there has been no report of a temperature change from the DRAM), then decision block 414 follows. At decision block 414 it is determined whether the timer 205 (FIG. 2) has timed out. If so, then the operations indicated at 406-410 follow, followed in turn by a return to the normal bus activity. If a negative determination is made at 414 (i.e., if the timer 205 has not timed out), then normal communication activity continues (block 402) without interruption for retraining.

The loop of decision blocks 404, 412, 414 may be repeated at relatively short time intervals and may be performed in background to or in parallel with the normal activity on the link 106.

Figure 5:
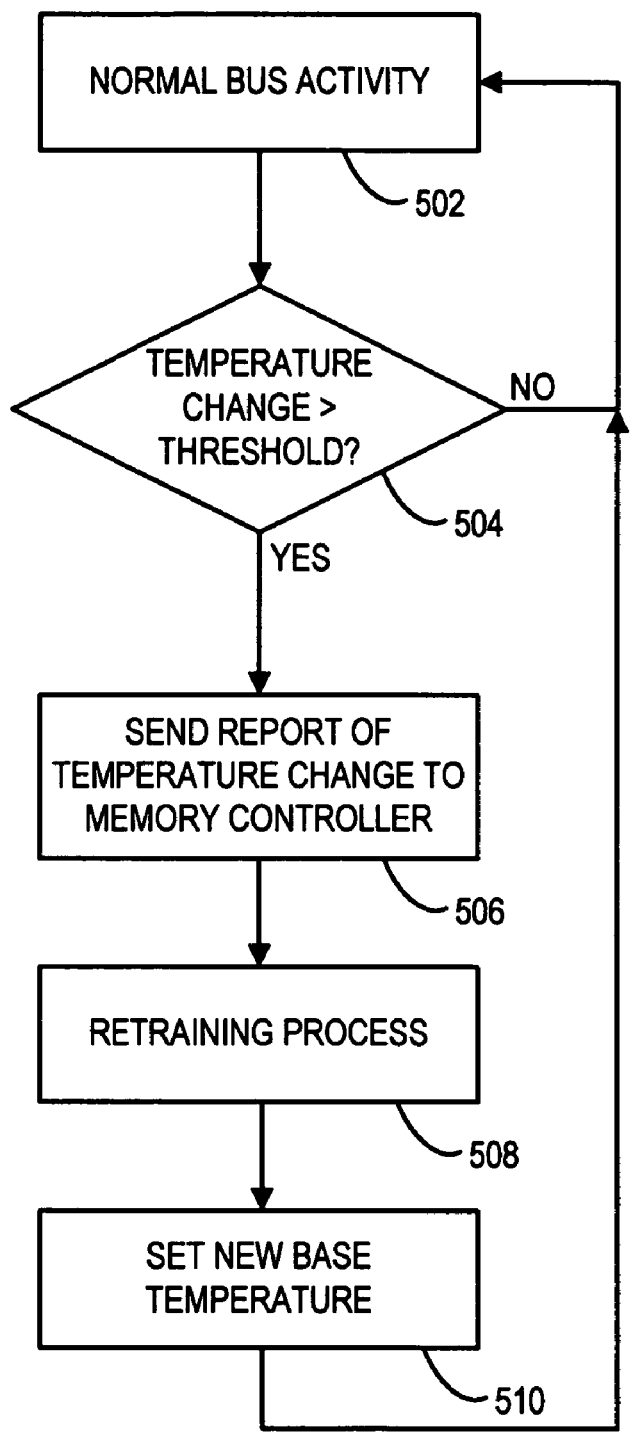
FIG. 5 is a flow chart that illustrates a process performed in the DRAM of FIG. 3.

FIG. 5 is a flow chart that illustrates a process performed in the DRAM 106 shown in FIG. 3.

Block 502 in FIG. 5 connotes normal exchange of data over the communication link 106 between the memory controller 102 (FIG. 2, not shown in FIG. 3) and the DRAM.

At decision block 504 in FIG. 5, a determination is made by temperature reading block 310 (FIG. 3) as to whether the thermal diode 308 indicates a change (in excess of a threshold amount, and relative to a base temperature setting for the DRAM) in the temperature in the DRAM. If a positive determination is made at 504 (i.e., if such a change in temperature is detected), then (as indicated at 506) the temperature reading block 310 causes the I/O block 302 of the DRAM to send to the memory controller, via the link 106, data or another signal to indicate that a temperature excursion has occurred in the DRAM.

As will be appreciated from the above discussion of FIG. 4, the transmission to the memory controller of the data or other signal indicating temperature change in the DRAM triggers the memory controller to initiate the retraining process, which is indicated by block 508 in FIG. 5. Then, at 510, the temperature reading block 310 resets the base temperature for the DRAM to the current temperature indicated by the thermal diode 308. (The operation indicated by block 510 may take place upon or after performance of any retraining process, whether or not triggered by the DRAM reporting a temperature excursion.) Normal bus activity (block 502) then resumes.

If a negative determination is made at block 504. normal bus activity (block 502) resumes.

In accordance with embodiments as described above, retraining for the communication link may be triggered upon an excursion in temperature in the integrated circuit (IC) at either end of the link. Since most, if not all, conditions that occasion a need for retraining may result from a relative temperature change between the two IC coupled by the link, and since temperature excursion in one IC is a good proxy for relative variation in temperature, the event-triggered retraining described above may handle virtually all retraining that is necessary to keep the link operating properly. As a result, regularly scheduled retraining may be eliminated entirely, or if backup retraining at regular intervals is implemented, as suggested by the above-described embodiments, the regularly scheduled retraining may be much less frequent than is conventional. Consequently, the overall frequency of retraining may be greatly reduced, so that there is less overhead on the communication link, and operation of the link becomes more efficient.

The descriptions of processes herein should not be understood to imply a fixed order of performing the process stages, which may be performed in any order that is practicable. For example, the order in which the decisions 404, 412, 414 (FIG. 4) are made may be varied. Also, certain operations in the processes described above may be omitted. For instance, the gating off (block 406, FIG. 4) of components that are not needed for retraining may be omitted.

The above-described embodiments have illustrated event-triggered (i.e., temperature-excursion triggered) retraining in the context of a communication link that couples a memory controller to a DRAM. However, event-triggered retraining may also be applied in other types of ICs that are coupled to differential communication links. Thus the thermal diodes and related circuitry described above may be incorporated in ICs other than memory controllers and DRAMs.

In the examples given above, the memory controller functions as a master device for the purpose of initiating retraining, and the DRAM functions as a slave device. However, these roles may be reversed, with the DRAM operating as the master device and the memory controller operating as the slave device.

The DRAMs are all indicated in FIG. 1 as being on the same circuit board as the memory controller. Alternatively, however, some or all of the DRAMs may be on a circuit board or boards that are different from the circuit board on which the memory controller is mounted. The number of DRAMs may be more or fewer than the three DRAMs shown.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A method comprising:
   detecting a change in temperature in a first integrated circuit that is coupled to a differential communication link, said differential communication link also coupled to a second integrated circuit to allow exchange of data between the first and second integrated circuits;
   responding to said detected change in temperature by initiating a retraining process for said differential communication link; and
   performing the initiated retraining process;
   wherein the retraining process includes first retraining logic that is part of the first integrated circuit interacting with a first phase interpolator to adjust a phase of a clock signal output from the first phase interpolator, the first phase interpolator being part of the first integrated circuit, the retraining process further including second retraining logic that is part of the second integrated circuit interacting with a second phase interpolator to adjust a phase of a clock signal output from the second phase interpolator, the second phase interpolator being part of the second integrated circuit.

2. The method of claim 1, wherein the second refraining logic initiates said refraining process.

3. The method of claim 1, wherein said detecting includes detecting an output of a thermal diode that is included in said first integrated circuit.

4. The method of claim 1, wherein the first retraining logic initiates said retraining process.

5. The method of claim 4, further comprising:
   gating off, during said refraining process, at least some components of said integrated circuit that are not required for said refraining process.

6. A method comprising:
   detecting a change of temperature in a first integrated circuit;
   sending a signal from said first integrated circuit to a second integrated circuit, said signal to indicate said detected change of temperature, said sending including sending said signal to said second integrated circuit via a differential communication link;
   responding to said signal by initiating a refraining process for said differential communication link; and
   performing the initiated refraining process;
   wherein the refraining process includes first refraining logic that is part of the first integrated circuit interacting with a first phase interpolator to adjust a phase of a clock signal output from the first phase interpolator, the first phase interpolator being part of the first integrated circuit, the retraining process further including second refraining logic that is part of the second integrated circuit interacting with a second phase interpolator to adjust a phase of a clock signal output from the second phase interpolator, the second phase interpolator being part of the second integrated circuit; and
   wherein said first integrated circuit is a dynamic random access memory (DRAM) device and said second integrated circuit is a memory controller.

* * * * *